(12) United States Patent
Murphy et al.

(10) Patent No.: US 9,282,680 B2
(45) Date of Patent: Mar. 8, 2016

(54) POWER CONNECTOR WITH THERMAL CONDUCTIVITY

(71) Applicant: Molex, LLC, Lisle, IL (US)

(72) Inventors: Joseph F. Murphy, Highland Park, IL (US); Tigist Woldegebriel, Glenview, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 14/384,753

(22) PCT Filed: Mar. 12, 2013

(86) PCT No.: PCT/US2013/030325
§ 371 (c)(1),
(2) Date: Sep. 12, 2014

(87) PCT Pub. No.: WO2013/138266
PCT Pub. Date: Sep. 19, 2013

(65) Prior Publication Data
US 2015/0118880 A1    Apr. 30, 2015

Related U.S. Application Data

(60) Provisional application No. 61/609,427, filed on Mar. 12, 2012.

(51) Int. Cl.
| | |
|---|---|
| *H01R 13/28* | (2006.01) |
| *H05K 7/20* | (2006.01) |
| *H01R 24/38* | (2011.01) |
| *H01R 13/533* | (2006.01) |
| *H01R 13/502* | (2006.01) |
| *H01R 13/52* | (2006.01) |
| *H01R 107/00* | (2006.01) |

(52) U.S. Cl.
CPC .......... *H05K 7/20409* (2013.01); *H01R 13/502* (2013.01); *H01R 13/521* (2013.01); *H01R 13/533* (2013.01); *H01R 24/38* (2013.01); *H01R 2107/00* (2013.01)

(58) Field of Classification Search
CPC ........................................................ H01R 13/28
USPC .......................................................... 439/284
See application file for complete search history.

(56) References Cited

U.S. PATENT DOCUMENTS 2,384,267 A * 9/1945 Andersen ...................... 439/284
4,364,626 A * 12/1982 Price ............................. 439/284

(Continued)

OTHER PUBLICATIONS

International Search Report for PCT/US2013/030325.

*Primary Examiner* — Tho D Ta
(74) *Attorney, Agent, or Firm* — Clarence R. Moon

(57) ABSTRACT

An electrical connector arrangement includes male and female connectors each having plural terminals connected to a respective conductor, and adapted for mutual physical and electrical mating. Each connector includes a respective overmold body coupled to a multi-conductor cable, a respective inner insulator disposed about and in contact with plural terminals, and an outer threaded coupling nut for coupling the two connectors together, where each insulator is comprised of an electrically insulating, thermally conductive material. In one connector, a conductive, cylindrical metal sleeve is disposed between its associated insulator and coupling nut. In that same connector, a generally circular metallic, spiral cooling spring is disposed between and in intimate contact with adjacent portions of the inner metal sleeve and the outer coupling nut to facilitate transfer and dissipation of heat via conduction and convection from the connector's outer surface.

23 Claims, 7 Drawing Sheets

(56) References Cited

U.S. PATENT DOCUMENTS

| | | |
|---|---|---|
| 4,758,174 A | 7/1988 | Michaels |
| 4,923,413 A | 5/1990 | Michaels |
| 4,990,099 A * | 2/1991 | Marin et al. .................. 439/284 |
| 5,021,012 A | 6/1991 | Shibano |
| 6,764,350 B2 | 7/2004 | Kosmala |
| 7,044,789 B2 | 5/2006 | Yohn et al. |
| 2009/0163086 A1 | 6/2009 | Janulis et al. |

* cited by examiner

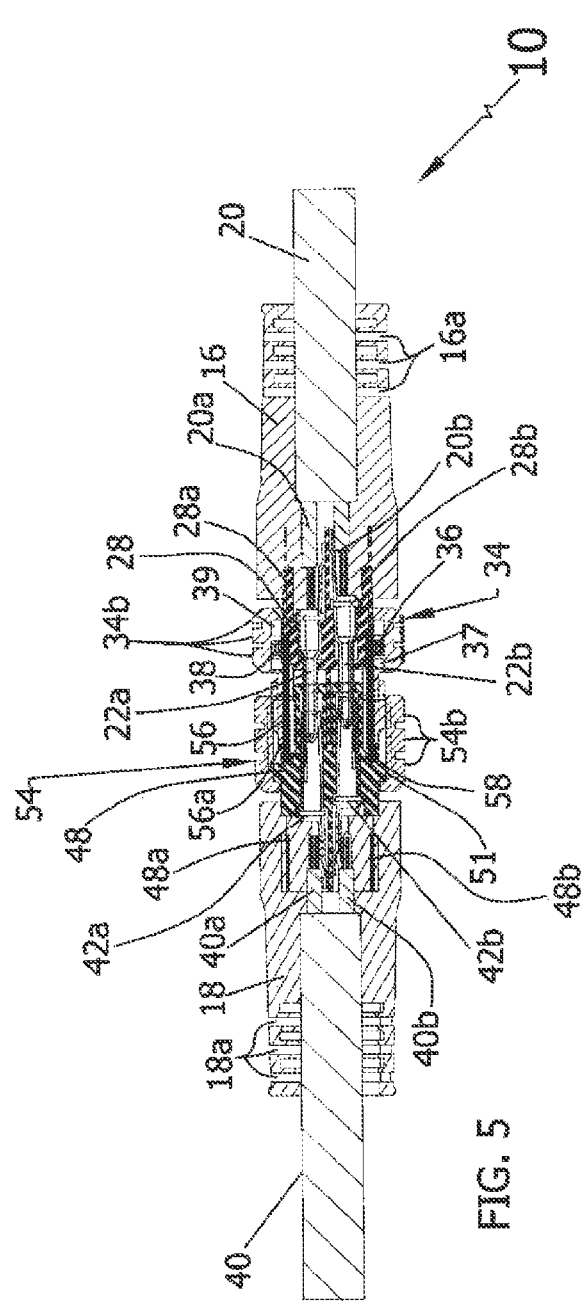
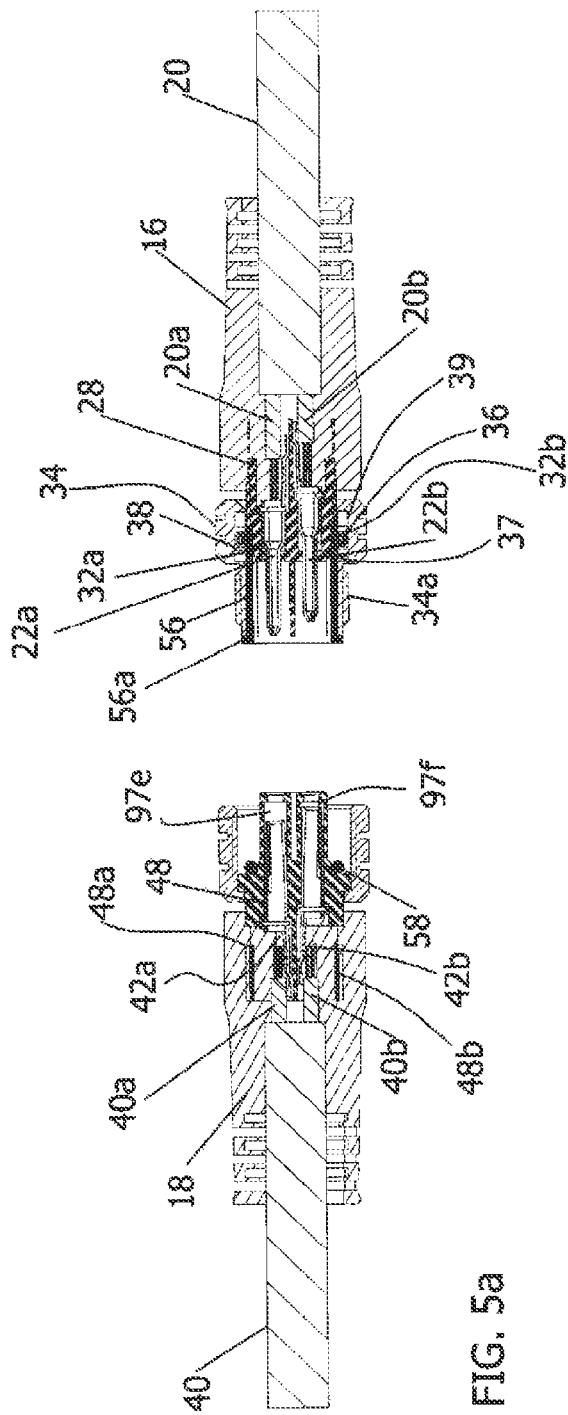
FIG. 5
FIG. 5a

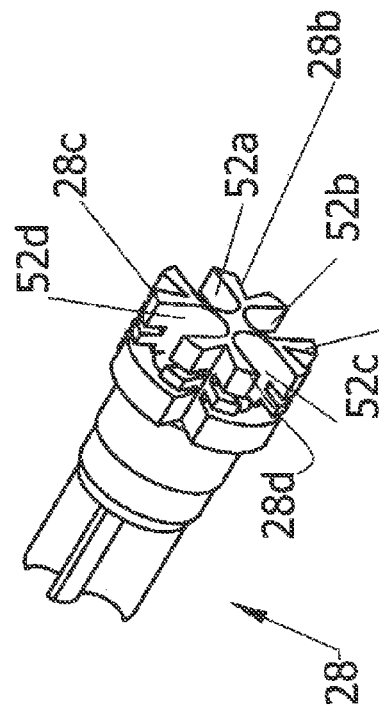
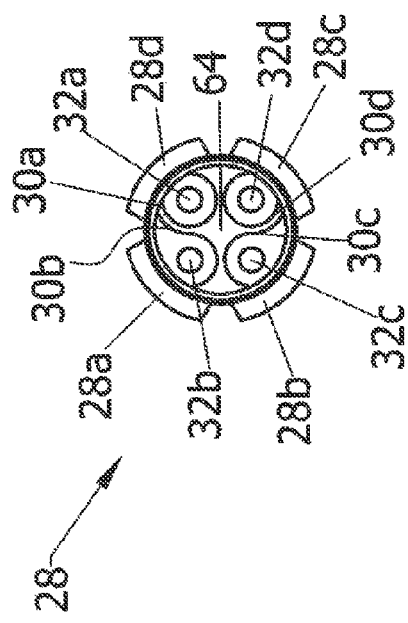
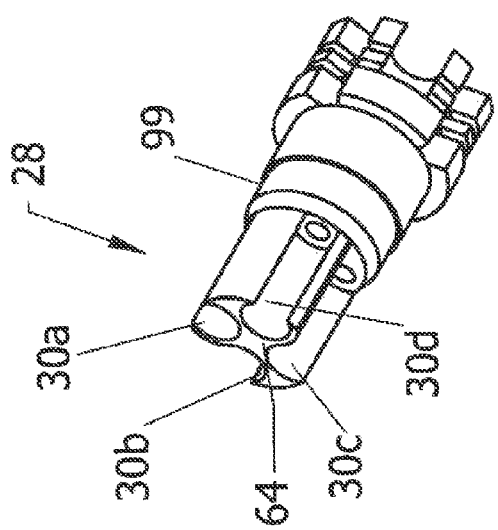

POWER CONNECTOR WITH THERMAL CONDUCTIVITY

RELATED APPLICATIONS

This application claims priority to U.S. Provisional Application No. 61/609,427, filed Mar. 12, 2012, which is incorporated herein by reference in its entirety.

FIELD OF THE INVENTION

This invention relates generally to electrical connectors and is particularly directed to an electrical power connector with improved thermal conductivity and dissipation to accommodate transmission of higher currents and increased power.

BACKGROUND OF THE INVENTION

A common type of electrical connector system includes a male assembly and a female receptacle connector, where the male assembly is inserted into the female receptacle assembly to establish electrical continuity. Heat is perhaps the most common cause of failure in these types of electrical connectors, particularly those carrying high currents and subject to increased power. Heat builds up in the connector and when not properly dissipated causes deterioration of connector components and failure of the connector. Efforts have been made in connector technology to limit and remove the heat in electrical connectors in an efficient manner. However, such efforts have relied almost entirely on thermal conduction and conventional connector designs resulting in only limited success. Success in these efforts has been made more difficult by the increasing use of higher currents and smaller connectors in almost all areas of technology, and particularly in computers, telecommunications and industrial applications.

In most cases, heat dissipation within a connector is limited by the presence of discontinuities within the connector which do not provide a continuous path of high thermal conductivity between the connector's internal conductors and its outer skin for heat dissipation to the atmosphere. In other connectors, while materials having high electrical insulative characteristics are used, these same materials have only limited thermal conductivity and do not promote heat dissipation from the connector.

The present invention addresses these limitations of the prior art by providing for the heat generating connector components a continuous path of low thermal resistance throughout the entire connector to its outer periphery, while completely encapsulating these sources of heat within the connector with materials having high electrical resistance and low resistance to thermal flow to facilitate heat discharge from the connector without the increased complexity and additional cost of a heat sink.

SUMMARY OF THE INVENTION

Accordingly it is an object of the present invention to provide an electrical power connector having increased thermal conductivity and dissipation to accommodate the transmission of higher currents and increased power.

It is another object of the present invention to employ thermal conduction and convection in an electrical connector having one or more conductors to direct heat via the connector's outer surface to the surrounding atmosphere.

Yet another object of the present invention is to limit heat build-up in an electrical power connector by using only components comprised of high thermal conductivity materials throughout the connector for efficiently dissipating heat from the connector to a heat sink or to the surrounding atmosphere.

A further object of the present invention is to use the combination of a solid metal cylindrical sleeve and a coiled, circular metal spring to direct heat from the interior of a current carrying electrical connector to its outer periphery for dissipation to the surrounding atmosphere.

A still further object of the present invention is to eliminate gaps and voids in an electrical connector having a body comprised of high thermal conductivity materials to facilitate the dissipation, or discharge, of heat from the conductor.

This invention further contemplates an arrangement in a multi-conductor electrical connector for completely encapsulating the connected, conducting male and female terminals within a continuous structure without gaps or voids comprised of a highly thermal conductive material to minimize heat build-up within the electrical conductor.

The present invention contemplates an electrical connector having one or more first terminals each adapted for electrical coupling to a respective one or more second terminals of a mating connector, wherein heat is generated in the connectors when rendered electrically conductive, the electrical connector comprising a first thermally conductive inner electrical insulator disposed about and in tight-fitting contact with the one or more first terminals; an elongated metal sleeve disposed about and in tight-fitting contact with the first insulator; a first outer thermally conductive coupling nut adapted for connection to the mating connector and disposed about and in tight-fitting contact with the metal sleeve; and at least one metallic coiled spring heat conductor disposed intermediate and in contact with the metal sleeve and the first coupling nut, wherein heat is transmitted from the one or more first terminals via the inner insulator, the metal sleeve and the metallic coiled spring heat conductor to the outer coupling nut for radiation from an outer surface of the coupling nut.

BRIEF DESCRIPTION OF THE DRAWINGS

The appended claims set forth those novel features which characterize the invention. However, the invention itself, as well as further objects and advantages thereof, will best be understood with reference to the following detailed description of a preferred embodiment taken in conjunction with the accompanying drawings, where like reference characters identify like elements throughout the various figures, in which:

FIG. 5 is a longitudinal sectional view of the assembled power connectors shown in FIG. 3;

FIG. 5a is a longitudinal sectional view of the power connector of the present invention in the un-mated condition;

FIG. 7 is a front view of the male insulator, or insert, used in the power connector of the present invention;

FIG. 8 is a front perspective view of the male insulator shown in FIG. 7;

FIG. 8a is a back perspective view of the male insulator shown in FIG. 7;

DETAILED DESCRIPTION OF THE PREFERRED EMBODIMENTS

Figure 1:
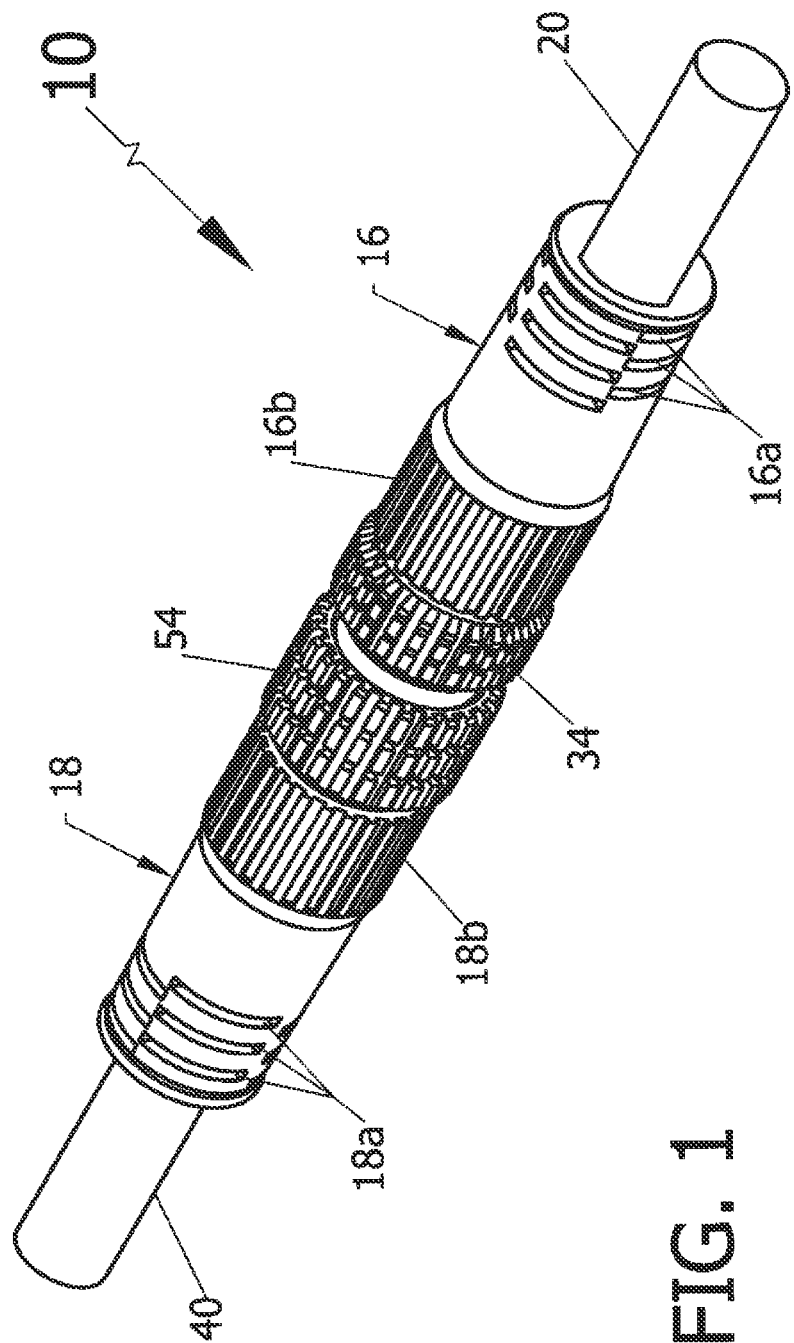
FIG. 1 is a perspective view of the male assembly and female assembly, in the mated condition, of the electrical power connector with thermal conductivity in accordance with the present invention.
Figure 2:
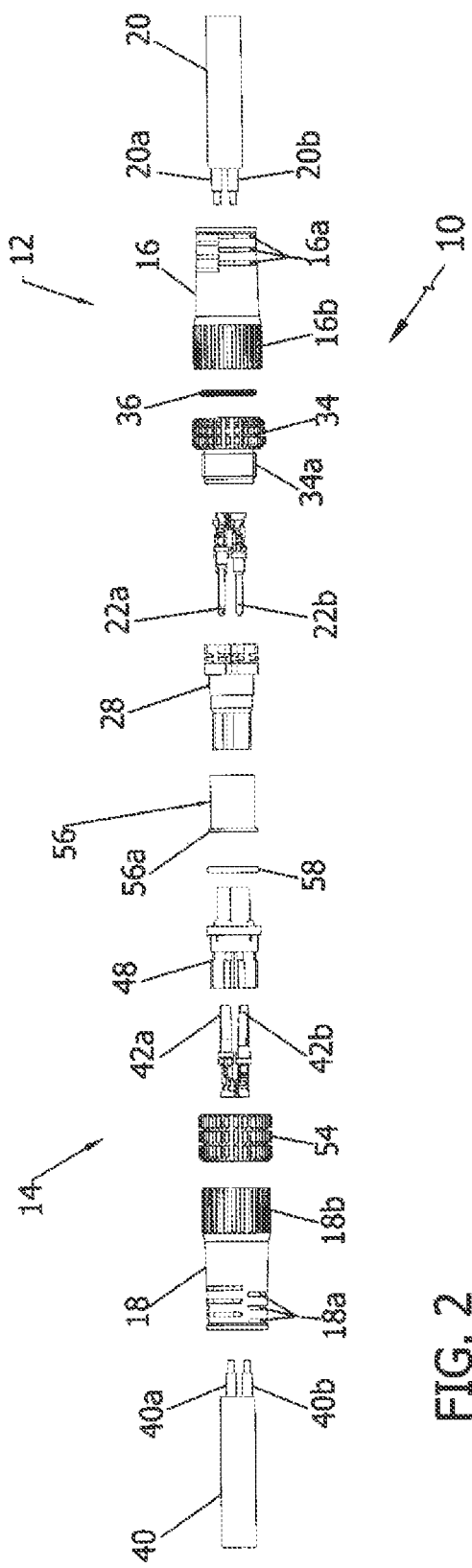
FIG. 2 is an exploded side elevation view of the male and female inventive power connectors.
Figure 3:
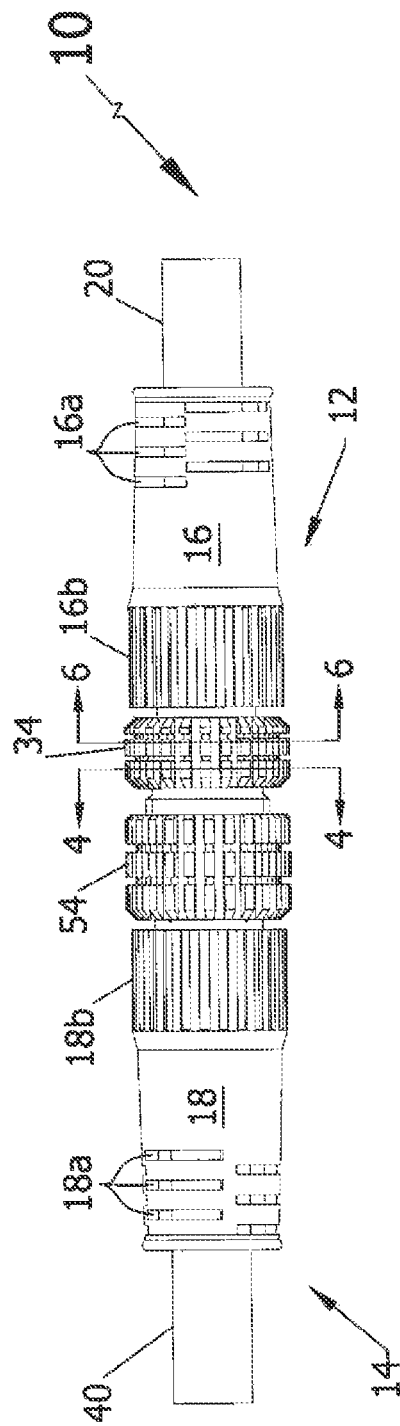
FIG. 3 is a side elevation view of the male and female power connectors of the present invention in the mated condition.
Figure 6:
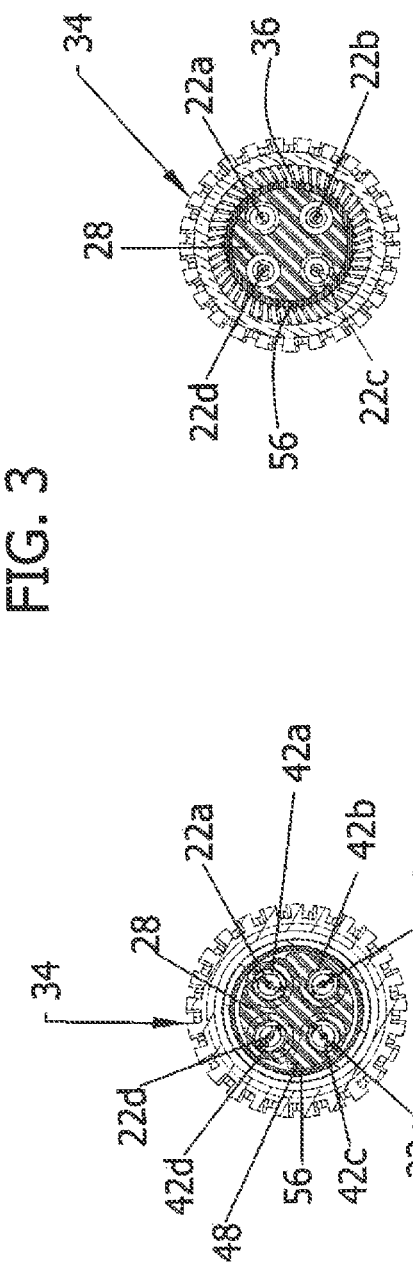
FIG. 6 is a transverse sectional view the power connector shown in FIG. 3 taken along sight line 6-6 therein.
Figure 4:
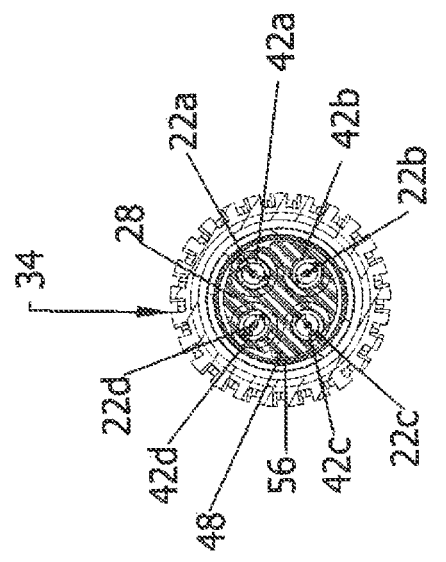
FIG. 4 is a transverse sectional view of the power connectors illustrated in FIG. 3 taken along sight line 4-4 therein.
Figure 10A:
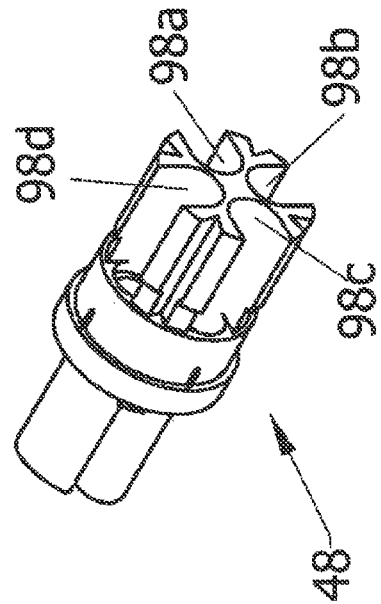
FIG. 10a is a back perspective view of the female insulator shown in FIG. 9.
Figure 9:
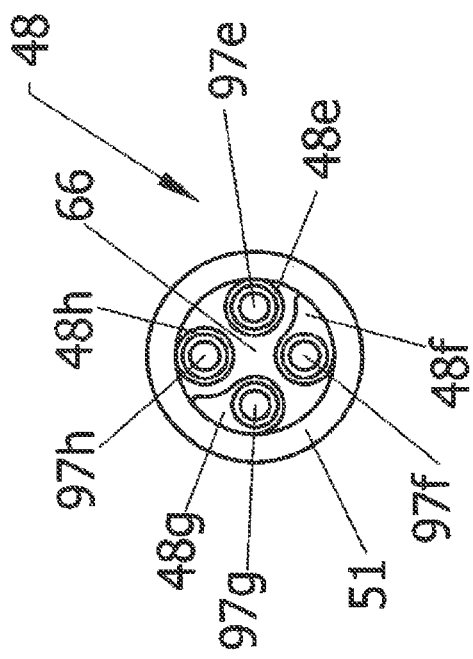
FIG. 9 is a front view of the female insulator, or insert, used in the power connector of the present invention.
Figure 10:
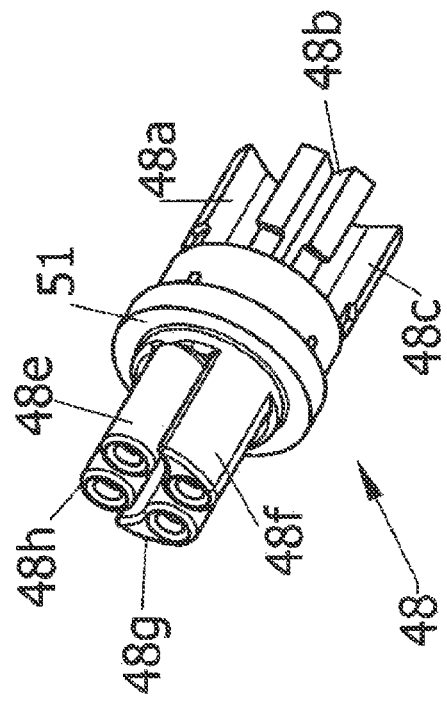
FIG. 10 is a front perspective view of the female insulator shown in FIG. 9.
Figure 11:
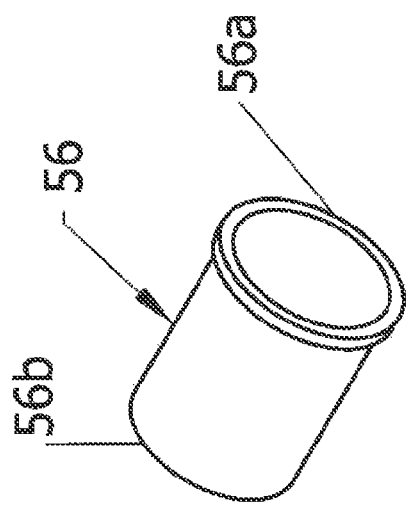
FIG. 11 is a perspective view of a cylindrical metal sleeve used in the power connector of the present invention.
Figure 13:
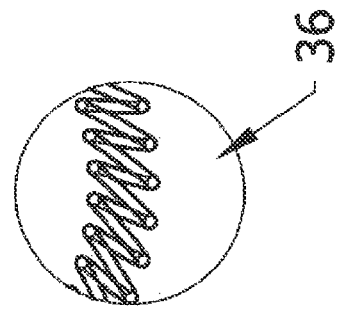
FIG. 13 is an enlarged view of a portion of the metallic internal cooling spring shown in FIG. 12.
Figure 12:
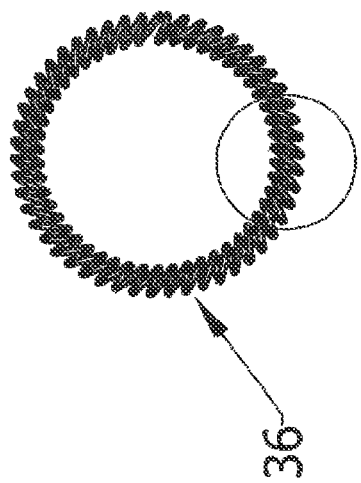
FIG. 12 is a plan view of a metallic internal cooling spring used in the power connector of the present invention.

Referring to FIGS. 1, 2 and 3 there are respectively shown perspective, exploded and side elevation views of a power connector 10 in accordance with the principles of the present invention. FIGS. 4 and 6 are sectional views of the electrical connector 10 shown in FIG. 3 taken respectively along sight lines 4-4 and 6-6 therein. FIGS. 5 and 5a are respectively mated and un-mated longitudinal sectional views of the inventive power connector 10. FIGS. 7, 8 and 8a are respectively front planar and front and rear perspective views of a male insulator, or insert, 28 used in the power connector of the present invention. FIGS. 9, 10 and 10a are respectively front planar and front and rear perspective views of a female insulator, or insert, 48 used in the inventive power connector. FIG. 11 is a perspective view of a cylindrical metal sleeve 56 used in the inventive power connector 10. FIG. 12 is a planar view of a metallic internal cooling spring 36 used in the inventive power connector. FIG. 13 is an enlarged view of a portion of the metallic internal cooling spring 36 shown in FIG. 12.

Power connector 10 is adapted for coupling plural electrical leads 20a and 20b in a first multi-conductor cable 20 to plural leads 40a and 40b in a second multi-conductor cable 40. On a first end of connector 10 is a first overmold body 16, while on a second opposed end of the connector is a second overmold body 18. First overmold body 16 is disposed about and engages the first multi-conductor cable 20 and an outer end of a male insulator 28 for maintaining these two components securely coupled together. Similarly, second overmold body 18 is disposed about and securely engages the second multi-conductor cable 40 and an outer end of a female insulator 48. Each of the first and second overmold bodies 16, 18 is comprised of an electrical insulating and thermally conductive material and includes respective plural spaced projections 16b, 18b, on an inner end as shown in FIG. 1. The spaced projections on the first and second overmold bodies 16, 18 facilitate the release of heat from the overmold bodies, and also facilitate gripping of the overmold body. First and second overmold bodies 16, 18 are applied to power connector 10 and to the first and second multi-conductor cables 20, 40 in a conventional manner using heat and pressure and provide cable strain relief.

Male insulator 28, which is shown in greater detail in FIGS. 7, 8 and 8a, includes a first outer end having plural segmented ribs, or fins, 28a, 28b, 28c and 28d. Ribs 28a-28d are radially disposed about the outer end of male insulator 28 and are formed so as to include plural segments to facilitate the outward radiation of heat from these ribs to dissipate connector heat during operation. Each pair of adjacent segmented ribs 28a-28d forms a respective curvilinear slot, as shown in FIG. 8a as elements 52a-52d. Each of the four spaced slots 52a-52d is adapted to receive the combination of a respective conductor extending from the first multi-conductor cable, or lead, 20 and a terminal connected to the lead. Thus, as shown in FIGS. 5 and 5a, two of these male terminals 22a and 22b with their respective attached leads 20a and 20b are positioned within respective male insulator slots. Male terminal 22a is shown connected to conductor 20a of the first multi-conductor cable 20 by means of a wire crimp. The remaining leads of the first multi-conductor cable 20 are similarly electrically coupled to an associated one of the male terminals by means of a wire crimp.

The inner end portion of the male insulator 28 is provided with plural spaced cylindrical slots 30a-30d disposed about the outer periphery of the insulator. At the base of slots 30a-30d is a respective aperture 32a-32d each of which is adapted to receive a respective male terminal which extends substantially along the length of an associated slot in the male insulator 28. These cylindrical, peripheral slots 30a-30d are each adapted to receive a respective one of male terminals, where two of these male terminals are shown as elements 22a and 22b in the figures.

The outer end of female insulator 48 is also provided with plural ribs, or fins, 48a, 48b, 48c and 48d disposed about its outer periphery in a spaced manner as shown in FIG. 10, where three of the four ribs are shown as elements 48a, 48b and 48c. Adjacent ribs in the female insulator 48 form slots shown as elements 98a-98d in FIG. 10a. Each of the slots 98a-98d is adapted to receive the combination of a respective conductor extending from the second multi-conductor cable or lead 40 and a terminal crimped to the lead. Two of these female terminals, 42a and 42b, with their respective attached leads 40a and 40b, are positioned within respective female insulator slots. As in the case of the male insulator 28, spaced ribs 48a-48d of the female insulator 48 promote and enhance the removal of heat from the female insulator and away from the female conductors and terminals discussed below. It is to be understood that in the embodiment of connector 10 of the present invention shown in the various figures, there are four each of the male and female terminals. However, the present invention is not limited to use with four leads and four pairs of male and female terminals, as this number is used herein only for illustrative purposes.

The second, inner end of female insulator 48 is provided with four spaced members 48e, 48f, 48g and 48h, two of which are cylindrical, and each having a respective inner hollow tube 97e, 97f, 97g, 97h, two of which are asymmetric, extending the length thereof. Each of the tubes in the spaced members 48e-48h is adapted to receive a respective female terminal as shown in FIGS. 5 and 5a as elements 42a and 42b.

By inserting each of the female terminals into the respective tube of one of the four spaced cylindrical members 48e-48h of the female insulator 48, electrical contact and continuity is established between the plural leads of the first multi-conductor cable 20 and the plural leads of the second multi-conductor cable 40, when the male connector 12 and female connector 14 are in the mated condition. The positioning of each of the female insulator's four spaced cylindrical members 48e-48h within, and in tight-fitting contact with, a respective one of slots 30a-30d within the male insulator 28 provides a solid body without any gaps in the heat conducting material encapsulating the male terminals and female terminals to provide effective and efficient removal of heat from the current connector members.

Disposed about and in tight-fitting engagement with adjacent, abutting portions of the male insulator 28 is a cylindrical metal sleeve 56 shown in perspective view in FIG. 11. Metal sleeve 56 includes a first end having a radially expanded collar 56a thereon, and a second opposed end portion 56b. With metal sleeve 56 in position within the assembled connector 10 as shown in FIG. 5, the metal sleeve's collar 56a is positioned in contact with an O-ring seal 58 disposed in tight-fitting engagement with an outer surface of female insulator 48. In this position, O-ring seal 58 is disposed in sealed contact with the metal sleeve's radial collar 56a and with a radial collar 51 extending outward from female insulator 48 and forms a seal between the female insulator and the metal sleeve. Metal sleeve 56 is preferably comprised of a highly thermal conductive metal such as brass or aluminum and forms an interference fit with thermo-plastic male insulator 28 when end 56b is pressed onto the male insulator's outer receiving surface 99.

Tightly disposed about the outer surfaces of adjacent portions of the male insulator 28 and the metal sleeve 56 is a male coupling nut 34, preferably made of a high thermal conductivity metal. As shown in FIG. 5 and FIG. 5a, the enlarged, outer end portion of the male coupling nut 34 is provided with plural spaced outer ribs 34b which facilitate radiation of heat from the coupling nut. The opposing inner end portion of the male coupling nut 34 is provided with outer threads 34a. Similarly, the female coupling nut 54, also preferably made of a high thermal conductivity metal. Female coupling nut 54 also is disposed about and tightly engages a portion of the outer surface of the female insulator 48 as shown in FIGS. 5 and 5a. As shown in the perspective view of FIG. 5, female coupling nut 54 also includes plural spaced outer ribs 54b to facilitate radiation of heat from this coupling nut.

Disposed within an inner radial slot 38 in an inner surface of the male coupling nut 34 is a metallic coiled cooling spring 36 as shown in the sectional views of FIGS. 5 and 5a. Metal spring 36 is heat conductive and in intimate contact with an outer surface of metal sleeve 56 and an inner surface of male coupling nut 34 so as to provide for the conductive transmission of heat from the inner metal sleeve to the outer male coupling nut. The coiled, or spiral, configuration of metal spring 36 also allows for the transmission of heat by radiation from the outer surface of metal sleeve 56 to the inner surface of male coupling nut 34. These two modes of thermal transmission increase the rate of heat removal from the wire crimps and the terminal contacts within the power connector 10 to its outer surface for release to the surrounding atmosphere. Referring to FIG. 6, coiled metal spring 36 preferably includes canted, or angled, coils to facilitate relative rotation between male sleeve 56 and coupling nut 34, and to reduce the possibility of kinking of the metal spring such as during connection/disconnection of the male and female connectors 12, 14. The interface between male coupling nut 34 and metal sleeve 56 may be provided with additional metal springs as shown in dotted line form in FIG. 5 as elements 37 and 39 each disposed within a respective annular inner slot within the male coupling nut for increased heat removal from the power connector 10 of the present invention. Those skilled in the art can easily see how this cooling spring could also be applied to the female coupling nut.

The ends of the male and female insulators 28, 48 are keyed to one another so as to facilitate the assembly of the male to the female connector 12, 14. Thus, the shape of an inner portion 64 of male insert 28 which is formed by the four spaced slots 30a-30d formed therein is keyed to the shape of the space 66 between the four spaced members 48e-48h at the inner end of female insulator 48. The complementary shapes of the inner portion 64 of male insulator 28 and the space 66 on the end of the female insulator 48 allow the two insulators to be connected together in a tight fitting manner so that the combination of the two insulators forms a generally cylindrical body having a solid, continuous structure comprised of a high thermal conductive material, as shown in FIG. 4. Each male and female terminal combination is in intimate contact with this high thermal conductive material which facilitates the transmission of heat from the terminals to the outer surface of the male and female insulator combination to efficiently and effectively dissipate the heat. In addition, the shape of members 48e-48h is complementary to the respective shapes of spaced slots 30a and 30d in male insulator 28 as shown in FIGS. 7 and 9. The complementary and matching shapes of these engaging portions of the male and female insulators 28, 48 facilitate aligning each of the male terminals with a respective one of the female terminals to facilitate coupling of the male and female connectors 12, 14 and insertion of each male terminal into an associated female terminal. Additionally, this arrangement allows the male connector 12 to be mated to the female connector 14 with little or no visual observation, commonly referred to in the conductor industry as a "blind mate condition".

An inner surface of female coupling nut 54 is provided with threads which are not shown for simplicity. By inserting the outer threads 34a of male coupling nut 34 into engagement with the inner threads of female coupling nut 54 and rotationally displacing one or both of the coupling nuts, the two coupling nuts may be drawn tightly together in a sealed manner. With the male coupling nut 34 also securely engaging male insulator 28 and with female coupling nut 54 also securely engaging female insulator 48 at its radial collar 51, the male connector 12 and female connector 14 may be drawn tightly together so as to establish sealed electrical contact between the male and female terminals within the power connector 10.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An electrical connector having one or more first terminals each adapted for electrical coupling to a respective one or more second terminals of a mating connector, wherein heat is generated in said connectors when rendered electrically conductive, said electrical connector comprising:
   a first thermally conductive inner electrical insulator disposed about and in tight-fitting contact with said one or more first terminals;
   an elongated metal sleeve disposed about and in tight-fitting contact with said first insulator;
   a first outer thermally conductive coupling nut adapted for connection to the mating connector and disposed about and in tight-fitting contact with said metal sleeve; and
   at least one metallic coiled spring heat conductor disposed intermediate and in contact with said metal sleeve and said first outer thermally coupling nut, wherein heat is transmitted from the one or more first terminals via said first thermally conductive inner electrical insulator, said metal sleeve and said coiled spring heat conductor to said first outer thermally conductive coupling nut for radiation from an outer surface of said first outer thermally conductive coupling nut.

2. The electrical connector of claim 1, wherein said first electrical insulator is comprised of a thermally conductive, electrically insulative thermo-plastic material.

3. The electrical connector of claim 1, wherein said first outer coupling nut includes plural spaced ribs on its outer surface to enhance heat radiation therefrom.

4. The electrical connector of claim 1, wherein said first inner electrical insulator includes plural spaced ribs on its outer surface to enhance heat radiation therefrom.

5. The electrical connector of claim 1 further comprising a second outer thermally conductive nut disposed on the mating connector and adapted for secure coupling to said first outer coupling.

6. The electrical connector of claim 1, wherein said one or more first and second terminals are each coupled to a respective one of first and second plural leads, respectively, and wherein said electrical connector further comprises first and second heat conductive overmold bodies respectively covering said first terminals and said first wires and said second terminals and said second wires, respectively.

7. The electrical connector of claim 1, wherein said coiled spring heat conductor is disposed within a generally circular slot disposed in and extending about an inner surface of said first outer coupling nut.

8. The electrical connector of claim 7, wherein said heat conductor is generally circular in shape and includes plural spaced coils disposed along its length for allowing for transmission of heat from said metal sleeve outward to said first coupling nut via conduction and convection.

9. The electrical connector of claim 1 further comprising a seal disposed between and engaging in an abutting manner adjacent portions of said metal sleeve and a second thermally conductive inner electrical insulator of the mating connector.

10. The electrical connector of claim 9, wherein said seal is in the general form of an O-ring.

11. The electrical connector of claim 10, wherein said seal is comprised of a compressible material.

12. The electrical connector of claim 9, wherein said mating connector includes a second thermally conductive inner electrical insulator disposed about and in tight-fitting contact with said one or more second terminals, and wherein said first and second electrical insulators are arranged in mutual alignment with a gap disposed between their adjacent ends, and wherein said elongated metal sleeve is disposed over said gap and in tight fitting contact with said second insulator.

13. The electrical connector of claim 12, wherein said first and second electrical insulators are comprised of a thermally conductive, electrically insulative thermo-plastic material.

14. The electrical connector of claim 12, wherein said first and second electrical insulators include first and second plural spaced ribs on respective outer surfaces thereof for facilitating radiation of heat from said electrical insulators.

15. The electrical connector of claim 1, wherein said first and second coupling nuts respectively have outer and inner threaded portions adapted for secure mutual coupling.

16. The electrical connector of claim 15, wherein said first and second coupling nuts respectively include first and second plural spaced ribs disposed on their respective outer surfaces to facilitate radiation of heat from said coupling nuts.

17. The electrical connector of claim 8, wherein said heat conductor is in the form of a generally circular, coiled spring.

18. The electrical connector of claim 17, wherein said coiled spring includes angled coils to facilitate relative motion between said first coupling nut and said metal sleeve without causing kinking of said coiled spring heat conductor.

19. An arrangement for use in mating male and female electrical connectors for coupling plural first leads to plural second leads, said arrangement comprising:
a first unitary body of electrically insulative and thermally conductive material and defining plural spaced, elongated, generally linear parallel first slots and having a first outer surface;
plural elongated, linear male terminals attached to said first unitary body, wherein each of said male terminals is aligned with and disposed within and along the length of a respective one of the first unitary body's first slots;
a second unitary body of electrically insulative and thermally conductive material having a second outer surface and further having plural spaced, elongated, generally linear parallel members each having a respective second slot therein;
plural female terminals each disposed within a respective second slot of said second body and adopted to receive and electrically couple to a respective male terminal;
a guide means formed in at least some of the linear parallel slots and the linear parallel members of said first and second unitary bodies, the guide means having a cylindrical outer periphery when said linear parallel members are inserted in said first slots, said guide means includes first lateral ribs disposed on outer portions of at least some of said linear parallel members of said second first body and second lateral ribs disposed on said second body, and said first and second lateral ribs are adapted for mutual engagement, and
wherein a thermally conductive sleeve is disposed about and in intimate contact with the peripheries of said first and second unitary bodies, and each of said first slots is adapted to receive in tight-fitting engagement a respective one of said generally linear parallel members of said second unitary body when said male terminals are inserted in said female terminals, and wherein said first and second unitary bodies are disposed in intimate contact with said male and female terminals respectively, and fill the space between adjacent male and female terminal combinations to form a continuous body of thermally conductive material to facilitate heat flow from said male and female terminal combinations to the outer surfaces of said first and second unitary bodies.

20. The arrangement of claim 19, wherein the arrangement has an outer periphery generally curvilinear in shape when said linear parallel members of said second body are inserted in the parallel first slots of said first body.

21. The arrangement of claim 19, wherein said first and second unitary bodies are comprised of a thermo-plastic material.

22. The arrangement of claim 19, wherein said thermally conductive sleeve is comprised of metal.

23. The arrangement of claim 19, wherein the coupling between the first and second unitary bodies is a blind mate condition coupling requiring little or no visual observation to establish coupling between the unitary bodies.

* * * * *